US008012875B2

(12) United States Patent
Vasilev

(10) Patent No.: US 8,012,875 B2
(45) Date of Patent: *Sep. 6, 2011

(54) METHOD AND APPARATUS FOR WORKPIECE SURFACE MODIFICATION FOR SELECTIVE MATERIAL DEPOSITION

(75) Inventor: Vladislav Vasilev, Novosibirsk (RU)

(73) Assignee: IPGRIP, LLC, Campbell, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/757,652

(22) Filed: Apr. 9, 2010

(65) Prior Publication Data

US 2010/0193364 A1  Aug. 5, 2010

Related U.S. Application Data

(63) Continuation of application No. 11/893,793, filed on Aug. 17, 2007, now Pat. No. 7,732,329.

(60) Provisional application No. 60/824,038, filed on Aug. 30, 2006.

(51) Int. Cl.
*H01L 21/44* (2006.01)

(52) U.S. Cl. ........ 438/677; 438/641; 438/674; 438/675; 257/E21.476

(58) Field of Classification Search .................. 438/641, 438/674, 675, 677; 257/E21.476
See application file for complete search history.

(56) References Cited

U.S. PATENT DOCUMENTS

| | | | |
|---|---|---|---|
| 3,411,952 A | 11/1968 | Ross et al. | |
| 4,024,029 A | 5/1977 | Rain et al. | |
| 4,110,176 A | 8/1978 | Creutz et al. | |
| 5,516,412 A | 5/1996 | Andricacos et al. | |
| 5,567,300 A | 10/1996 | Datta et al. | |
| 5,807,165 A | 9/1998 | Uzoh et al. | |
| 5,862,605 A | 1/1999 | Horie et al. | |
| 6,004,880 A | 12/1999 | Liu et al. | |
| 6,074,546 A | 6/2000 | Sun et al. | |

(Continued)

FOREIGN PATENT DOCUMENTS

EP   1 063 696 A1   12/2000

(Continued)

OTHER PUBLICATIONS

Chen et al., "Achieving area-selective atomic layer deposition on patterned substrates by selective surface modification", *Applied Physics Letters* 86, 191910 (2005).

(Continued)

*Primary Examiner* — Charles D Garber
*Assistant Examiner* — Angel Roman
(74) *Attorney, Agent, or Firm* — Knobbe, Martens, Olson & Bear LLP

(57) ABSTRACT

In some embodiments, a workpiece-surface-influencing device preferentially contacts the top surface of the workpiece, to chemically modify the surface at desired field areas of the workpiece without affecting the surfaces of cavities or recesses in the field areas. The device includes a substance which is chemically reactive with material forming the workpiece surface. The substance can be in the form of a thin film or coating which contacts the surface of the workpiece to chemically modify that surface. The workpiece-surface-influencing device can be in the form of a solid state applicator such as a roller or a semi-permeable membrane. In some other embodiments, the cavities are filled with material that prevents surface modification of the cavity surfaces while allowing modification of the field areas, or which encourages surface modification of the cavity surfaces while preventing modification of the field areas. The modified surface facilitates selective deposition of materials on the workpiece.

30 Claims, 17 Drawing Sheets

U.S. PATENT DOCUMENTS

| | | | |
|---|---|---|---|
| 6,090,239 A | 7/2000 | Liu et al. |
| 6,176,992 B1 | 1/2001 | Talieh |
| 6,185,354 B1 | 2/2001 | Kronz et al. |
| 6,224,737 B1 | 5/2001 | Tsai et al. |
| 6,245,676 B1 | 6/2001 | Ueno |
| 6,251,235 B1 | 6/2001 | Talieh et al. |
| 6,270,647 B1 | 8/2001 | Graham et al. |
| 6,284,121 B1 | 9/2001 | Reid |
| 6,303,014 B1 | 10/2001 | Taylor et al. |
| 6,346,479 B1 | 2/2002 | Woo et al. |
| 6,353,623 B1 | 3/2002 | Munks et al. |
| 6,354,916 B1 | 3/2002 | Uzoh et al. |
| 6,375,823 B1 | 4/2002 | Matsuda et al. |
| 6,402,925 B2 | 6/2002 | Talieh |
| 6,410,418 B1 | 6/2002 | Yang |
| 6,436,267 B1 | 8/2002 | Carl et al. |
| 6,471,847 B2 | 10/2002 | Talieh et al. |
| 6,482,656 B1 | 11/2002 | Lopatin |
| 6,497,800 B1 | 12/2002 | Talieh et al. |
| 6,506,103 B1 | 1/2003 | Ohmori et al. |
| 6,534,116 B2 | 3/2003 | Basol |
| 6,600,229 B2 | 7/2003 | Mukherjee et al. |
| 6,605,534 B1 | 8/2003 | Chung et al. |
| 6,610,190 B2 | 8/2003 | Basol et al. |
| 6,653,226 B1 | 11/2003 | Reid |
| 6,676,822 B1 | 1/2004 | Talieh |
| 6,766,082 B2 | 7/2004 | Hirabayashi et al. |
| 6,787,460 B2 | 9/2004 | Lee et al. |
| 6,833,063 B2 | 12/2004 | Basol |
| 6,848,970 B2 | 2/2005 | Manens et al. |
| 6,867,136 B2 | 3/2005 | Basol et al. |
| 6,902,659 B2 | 6/2005 | Talieh |
| 6,927,158 B2 | 8/2005 | Aoyama et al. |
| 6,936,154 B2 | 8/2005 | Basol et al. |
| 6,942,780 B2 | 9/2005 | Basol et al. |
| 6,958,114 B2 | 10/2005 | Talieh et al. |
| 6,974,775 B2 | 12/2005 | Keser et al. |
| 7,051,934 B2 | 5/2006 | Lee et al. |
| 7,201,829 B2 | 4/2007 | Basol et al. |
| 7,238,092 B2 | 7/2007 | Basol et al. |
| 7,238,610 B2 | 7/2007 | Barns |
| 7,449,098 B1 | 11/2008 | Mayer et al. |
| 2003/0054729 A1 | 3/2003 | Lee et al. |
| 2005/0029123 A1 | 2/2005 | Uzoh et al. |
| 2005/0153547 A1 | 7/2005 | Barns |
| 2005/0181252 A1 | 8/2005 | Risen et al. |
| 2006/0234499 A1 | 10/2006 | Kodera et al. |
| 2007/0241436 A1 | 10/2007 | Ookubo et al. |

FOREIGN PATENT DOCUMENTS

| | | |
|---|---|---|
| EP | 1 122 989 A2 | 8/2001 |
| JP | 11-238703 | 8/1999 |
| JP | 2000-208443 A | 7/2000 |
| WO | WO 01/32362 A1 | 5/2001 |

OTHER PUBLICATIONS

Kim et al. "Additive-Free Superfilling in Damascene Cu Electrodeposition Using Microcontact Printing." Electrochemical and Solid-State Letters, 2004, 7(9): C101-C103.

Krytox FAQ, http://www2.dupont.com/Lubricants/en_US/uses_apps/faqs_krytox.html, Nov. 18, 2008.

Park et al., "Microcontact patterning of ruthenium gate electrodes by selective area atomic layer deposition", *Applied Physics Letters* 86, 051903 (2005).

PCT Notification of Transmittal of the International Search Report and the Written Opinion of the International Searching Authority, or the Declaration, mailed Aug. 21, 2008 in International application number, PCT/US07/76446, filed Aug. 21, 2007.

Reid et al., "Factors influencing damascene feature fill using copper PVD and electroplating", *Solid State Technology*, Jul. 2000, 7 pages.

Sinha et al., "Area-selective ALD of titanium dioxide using lithographically defined poly(methyl methacrylate) films", *Journal of the Electrochemical Society* 153 (5) G465-G469 (2006).

Tri-Flow brochure, http://www.kpg-industrial.com/resources/literature/tri-flow_brochure.pdf, Nov. 18, 2008.

US 8,012,875 B2

METHOD AND APPARATUS FOR WORKPIECE SURFACE MODIFICATION FOR SELECTIVE MATERIAL DEPOSITION

REFERENCE TO RELATED APPLICATION

This application is a continuation of U.S. patent application Ser. No. 11/893,793, filed Aug. 17, 2007, which claims the priority benefit under 35 U.S.C. §119(e) of provisional Application No. 60/824,038, filed Aug. 30, 2006.

BACKGROUND OF THE INVENTION

1. Field of the Invention

The present invention relates generally to selective modification of the surface of a workpiece. More particularly, the present invention relates to selectively modifying the workpiece surface to allow selective deposition on the workpiece, such as selective deposition on a semiconductor substrate during integrated circuit fabrication.

2. Description of the Related Art

Many steps are typically performed to manufacture multi-level interconnects for integrated circuits (IC). Such steps include depositing conducting and insulating materials on a workpiece, such as a semiconductor substrate or wafer, followed by full or partial removal of these materials using photolithography to pattern photoresist to selectively remove material by selective exposure to etchant, such as during damascene processing, to form a desired pattern of recessed features such as vias, contact holes, lines, trenches and channels. These features may be referred to generally as recesses or cavities, and the overlying surfaces in which the features are formed may be referred to as field areas or the top surface of the workpiece. Typically, the field areas are planar. The recesses typically come in a wide variety of dimensions and shapes and are filled with a highly conductive material using electro- or electroless plating or other methods of material deposition. Common filling techniques deposit material both in the recesses and on the field areas. Consequently, additional processing steps such as etching and/or chemical mechanical polishing (CMP) are typically performed to remove the excess material deposited on field areas. A low resistance interconnection structure is formed between the various sections of the IC after completing these deposition and removal steps multiple times.

Copper (Cu) and copper alloys are typically used for interconnections in ICs because of their low electrical resistivity and high resistance to electromigration. Electrodeposition is a common method for depositing copper into recesses on a workpiece surface.

A conventional electrodeposition method and apparatus are described in FIGS. 1A and 1B. FIG. 1A illustrates a cross-sectional view of a workpiece 10 having an insulator forming its top section. Using conventional deposition and etching techniques, features 18a, 18b such as a dense array of small vias 18a or trenches 18b are formed in the workpiece. Typically, the widths of the vias 18a may be sub-micron. The vias 18a may be narrow and deep; in other words, they can have high aspect ratios (i.e., their depth to width ratio is large). A dual-damascene structure (not shown), on the other hand, has a wide trench and a small via on the bottom. The wide trench has a small aspect ratio.

FIG. 1B illustrates a conventional method for filling the recesses of FIG. 1A with copper. The workpiece 10 and the insulator have deposited thereon a barrier or adhesion layer and a seed layer' overlying the barrier or adhesion layer. For ease of illustration, the barrier and seed layer are referred to together by the reference numeral 12.

With reference to FIG. 1B, after depositing the seed layer 12, a conductive material 14, e.g., copper, is electrodeposited on the seed layer 6 from a plating bath. During this step, electrical contact is made to the seed layer and/or the barrier layer 12 so that a cathodic (negative) voltage can be applied thereto with respect to an anode (not shown). Thereafter, the conductive material 14 is electrodeposited over the workpiece surface using the plating solution. The seed layer 12 is shown as an integral part of the deposited layer of conductive material 14 in FIG. 1B. By using additives, such as chloride ions, suppressors/inhibitors, and accelerators, it is possible to obtain bottom-up growth of conductive material (such as copper) in the recesses.

As shown in FIG. 1B, the deposited copper 14 completely fills the vias 18a and is generally conformal in the large trench 18b. Copper does not completely fill the trench 18b, however, because the additives are not operative in large features. For example, it is believed that the bottom up deposition observed in vias and other features with large aspect ratios occurs because the suppressor/inhibitor molecules attach themselves to the top portion of the feature openings to suppress the material growth thereabouts. These molecules cannot effectively diffuse through the narrow openings to the bottom surface of high aspect ratio features such as the vias 18a of FIG. 1. Preferential adsorption of the accelerator on the bottom surface of the vias 18a, moreover, results in faster growth in that region, resulting in bottom-up growth and the copper deposit profile shown in FIG. 1B. Consequently, as can be seen in FIG. 1B, the relatively large aspect ratio features 18a are overfilled, while relatively large aspect ratio features 18b are filled more conformally. It will be appreciated that, without the appropriate additives, copper can grow on the vertical walls as well as the bottom surface of the high aspect ratio features at the same rate, thereby causing defects such as seams and voids, as is well known in the industry.

In the next step of interconnect formation, excess deposited material 14 is removed from the field areas of the workpiece 10, leaving conductive material 14 in trenches, vias and other recesses in the workpiece. This step eliminates electrical contacts between interconnects or other features formed by the conductive material 14. As known in the art, a common technique for selective material removal from the top of a workpiece is Chemical Mechanical Planarization (CMP). After the CMP step, the material 14 is completely removed from field areas 14, as shown in FIG. 1C.

CMP technology is well accepted in the integrated circuit fabrication industry and has became a standard part of manufacturing processes. However, various problems may limit the use of CMP in the fabrication of future generations of integrated circuits. These problems include, for example, dishing and erosion (excessive removal of conducting or dielectric material), high process cost, defects, and limited applicability for low-k materials.

To reduce or eliminate the problems associated with CMP, several methods have been developed for selective material deposition in only recessed areas of a workpiece.

A new class of plating techniques, called Electrochemical Mechanical Deposition (ECMD), has been developed to deposit material on workpieces with cavities. U.S. Pat. No. 6,176,992, entitled "Method and Apparatus for Electrochemical Mechanical Deposition", discloses a technique that achieves deposition of the conductive material into the cavities on a workpiece surface, while minimizing deposition on field regions. This ECMD process results in planar material deposition; but simultaneous polishing and material deposition is prone to critical defect formation.

U.S. Pat. Nos. 7,051,934, 6,974,775, 6,787,460, and 6,410,418 describe various other methods for selective plating or deposition. These methods, however, are faced with various problems that limit their practical applicability.

Accordingly, a need exists for methods and systems for controlling deposition onto desired parts of a workpiece.

SUMMARY OF THE INVENTION

According to one aspect of the invention, a method for semiconductor processing is provided. The method comprises providing a workpiece having a top surface and a pattern of recesses in the top surface. The top surface is selectively contacted, relative to surfaces of the recess, with a surface modification agent to chemically modify the top surface. Subsequently, material is selectively deposited into the recesses. Deposition of the material is inhibited on the top surface.

According to another aspect of the invention, a method for integrated circuit fabrication is provided. The method comprises providing a substrate having a field area and a cavity open to the field area. One of the field area and a surface of the cavity is selectively chemically modified relative to the other of the field surface and the surface of the cavity. Subsequently, material is selectively deposited on the other of the field surface and the surface of the cavity.

According to yet another aspect of the invention, a system for integrated circuit fabrication is provided. The system comprises a source of a surface modification agent for modifying a substrate surface. A solid state chemistry carrier is configured to apply the surface modification agent onto a surface of the substrate by mechanically contacting the surface of the substrate. The system also comprises a deposition apparatus for depositing material onto the substrate.

BRIEF DESCRIPTION OF THE DRAWINGS

The invention will be better understood from the detailed description of the preferred embodiments and from the appended drawings, which are meant to illustrate and not to limit the invention.

DETAILED DESCRIPTION OF THE PREFERRED EMBODIMENT

Figure 1A:
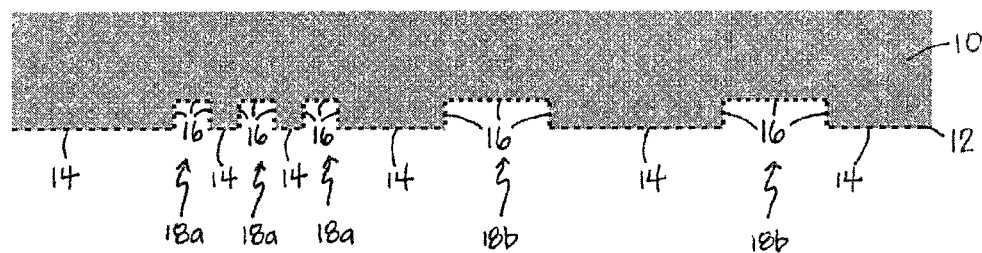
FIGS. 1A-1C are schematic, cross-sectional side views of a workpiece in a sequence of steps for performing a damascene-type copper electroplating and CMP process according to the prior art.

Embodiments of the invention provide methods and apparatus for controlled modification of the surface material of a workpiece. A surface modification agent selectively modifies the surface material by, e.g., selectively contacting desired parts of the workpiece or by selectively accumulating in desired parts of the workpiece. The modification prevents deposition on those surfaces. The surface modification allows material to be selectively deposited in recesses in the workpiece, but not field areas. Alternatively, material may be selectively deposited in the field areas but not in recesses.

Advantageously, embodiments of the invention eliminate or significantly reduce the necessity for planarization or removal of excess deposited material. For example, features can be formed in recesses without requiring CMP to remove material deposited in field areas, thereby avoiding drawbacks associated with CMP (e.g., drawbacks such as excessive removal of conducting or dielectric material, high process cost, defects, and limited applicability for low-k materials). The elimination or reduction in the need for a CMP step enables further advantages, such as the possibility of using a variety of fragile low-k materials to form damascene structures. Another advantage of some embodiments of the invention is the ability for selective material deposition on field areas of a workpiece, thus allowing selective modification of dielectric part of damascene structure. Moreover, embodiments of the invention provide simple and robust systems and methods for selective surface modification.

In some embodiments, a workpiece-surface-influencing device, or applicator, preferentially contacts the top surface of the workpiece without contacting the surfaces of cavities in the workpiece. Chemical modification of the contacted field areas of the workpiece is achieved and the surfaces of non-contacted cavities are not chemically modified. Without being limited by theory, it is believed that the surface chemical modification is achieved by contact chemical reaction of the workpiece surface with a substance which is chemically reactive with material forming the surface of the workpiece. The chemically active material can be in the form of a thin film or a coating on the applicator, which allows contact with the top surface of the workpiece.

In other embodiments, the cavities of a workpiece can be filled with a masking material. In some embodiments, unmasked field areas of the workpiece are left exposed and are chemically modified. In other embodiments, the surfaces of cavities in the workpiece are chemically altered while field areas remain unaltered.

After selectively altering surfaces of the workpiece, material can be selectively deposited on unaltered surfaces. A conductive material, such as copper, can be deposited on unaltered surfaces, such as cavity surfaces, by electrochemical plating. For example, embodiments of the invention can allow selective metal deposition in trenches for damascene processes to form semiconductor or integrated circuit structures.

It will be appreciated that electrochemical deposition typically utilizes barrier and seed layers to facilitate the deposition. Advantageously, in some embodiments of the invention, selective surface modification can be performed before deposition of the barrier and/or seed layer. In such embodiments, the barrier and/or seed layer deposition can be provided only in trenches and vias, which can be advantageous for avoiding unnecessary contamination of interconnect/interlayer dielectrics, thereby resulted in a superior interconnect structure.

With reference to the description herein, it will be appreciated that the terms, chip, integrated circuit, monolithic device, semiconductor device, and microelectronic device, are used interchangeably.

The terms metal line, trace, wire, conductor, signal path and signaling medium are all related and may be formed using embodiments of the invention. The related terms listed above are generally interchangeable and appear in order from more specific to more general.

Metal lines may also be referred to as traces, wires, lines, interconnects or simply metal. Metal lines, which can be formed of copper (Cu) or an alloy of Cu and another metal or metals, such as nickel (Ni), aluminum (Al), titanium (Ti) and molybdenum (Mo), or stacked layers of different metals, alloys or combinations thereof, are conductors that provide signal paths for coupling or electrically interconnecting electrical circuitry.

Conductors other than metal may also be used to form microelectronic devices. Materials such as doped polysilicon, doped single-crystal silicon (often referred to simply as diffusion doped, regardless of whether such doping is achieved by thermal diffusion or ion implantation), titanium (Ti), molybdenum (Mo), and refractory metal silicides are examples of other conductors.

As used herein, the term metal applies both to substantially pure single metallic elements and to alloys or combinations of two or more elements, at least one of which is a metallic element.

Substrate generally refers to the physical object that is the basic workpiece, which is transformed by various process operations into a desired electronic device, such as an integrated circuit. Substrates may include conducting material (such as copper or aluminum), insulating material (such as ceramic, plastic, or sapphire), semiconducting materials (such as silicon), non-semiconducting material, or combinations of semiconducting and non-semiconducting materials. In some embodiments, substrates include layered structures such as a sheet of material chosen for electrical and/or thermal conductivity (such as copper or copper plated nickel/iron alloys) covered with a layer of dielectric, such as plastic, chosen for electrical insulation, stability, and embossing characteristics. In some other embodiments, the workpiece can be a solar panel.

The term vertical is defined to mean substantially perpendicular to the major surface of a substrate. Height or depth refers to a distance in a direction perpendicular to the major surface of a substrate.

The term top surface or field area refers to a surface of a workpiece which is outside of a recess and in which the recess is formed. It will be appreciated that, where the recess opens upward, the top surface is above the level of the recess and wherein the recess opens downward, the top surface is below the level of the recess.

Reference will now be made to the Figures, in which like numerals and like hatching refer to like parts throughout. It will be appreciated that the Figures are not necessarily drawn to scale.

As noted above, FIGS. 1A-1C illustrate, in simplified, cross-sectional schematic form, a sequence of steps for performing a damascene type copper electroplating and CMP process according to prior art practices. Damascene processing typically includes the following simplified steps:
1. Create recessed areas in isolated (dielectric) materials on a substrate where interconnects will be placed.
2. Sputter (or electroless deposit) material to coat the entire surface of the substrate.
3. Blanket electroplate metal (e.g., Cu) to fill the imprinted features and cover the entire substrate with metal.
4. Grind off excess metal down to the top surface of the substrate.

FIG. 1A shows a patterned substrate 10 with barrier and seed layers 12 overlying the top surface 14 and surfaces 16 of recesses 18a, 18b in the substrate 10. The substrate 10 (formed of insulating material in the illustrated section) is embossed with a pattern of channels 18b located amongst raised areas 20. These channels 18b define where the final traces will ultimately be formed.

Figure 1B:
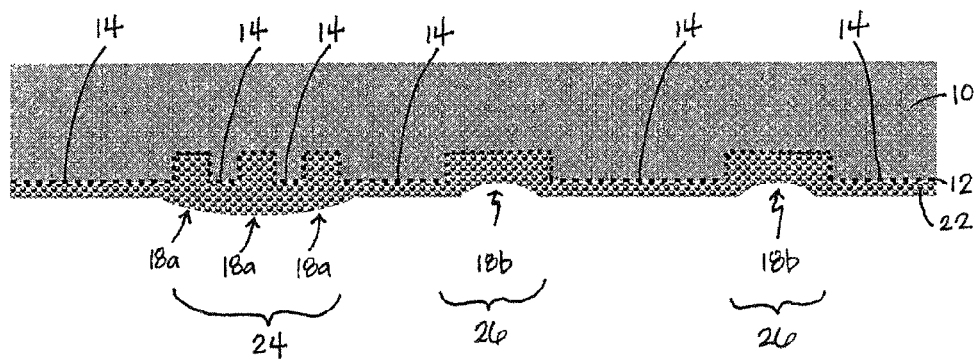

With reference to FIG. 1B, a conductive layer 22, such as a sputtered conductor, such as copper or nickel or other suitable metal, or an electrolessly deposited material such as nickel or copper, is formed on the substrate 10. Wet chemical electroplating can also be used to plate additional material (such as copper or other suitable metal) to a suitable thickness to form the layer 22. Dense areas 24 with small features 18a are overfilled and areas 26 with wide channels or trenches 18b are filled below the level of the top surface 14 as a result of deposition by electroplating. Material deposited on field areas 14 is typically as thick as or exceeds the depth of the trenches 18b.

Figure 1C:
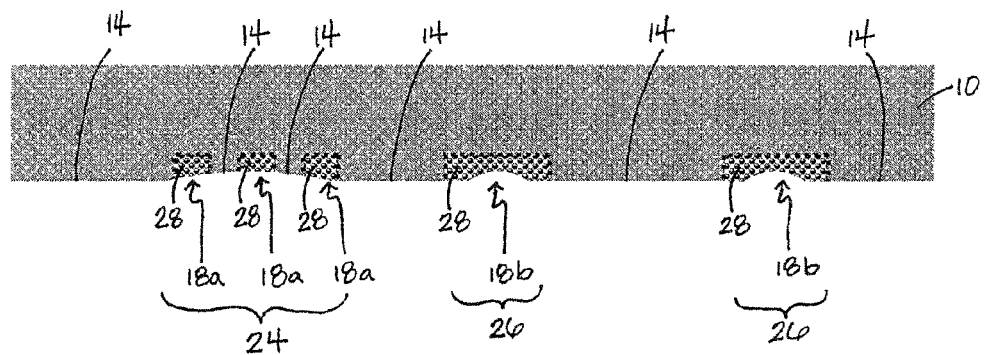

FIG. 1C shows embossed substrate 10 after the thick plating layer 22 has been mechanically polished off field areas 14, leaving separated traces 28 isolated from one another in recesses or channels 18a, 18b by insulating material of the substrate 10 layer. The top surface 14, as a result of one or more grinding or polishing steps, typically exhibits roughness at some scale.

Undesirably, CMP processes can cause dishing (recess in metal lines), as illustrated in the areas 26, and erosion (recess in dielectric lines), as illustrated in the area 24. Another difficulty that arises in CMP processes is uneven polishing, particularly when performed on a large substrate. Even if polishing is evenly performed across the entire substrate, overpolishing of the deposited metal (i.e., excess material removal) can result in traces that are too thin, while underpolishing of the deposited metal (i.e., insufficient material removal) can result in shorts between traces. Uneven polishing can result from variations in the substrate thickness or stiffness, or variations in the embossing surface or pressure applied during embossing. Thus, the resulting traces can vary in thickness and conductive properties. Grinding can also cause the traces to have a rough grooved surface, making later connections to the traces difficult, costly, and/or unreliable.

Figure 2A:
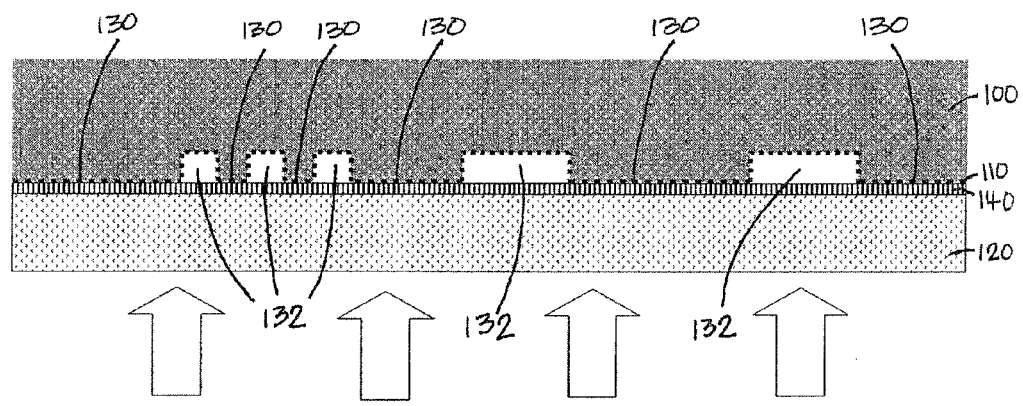
FIG. 2A-2C are schematic, cross-sectional side views of a workpiece having a pattern of recesses with barrier and seed layers and a chemistry carrier in contact with the top surface of the workpiece, in accordance with some embodiments of the invention. The barrier/seed layers on the top surface are chemically modified and material is selectively deposited into recesses.
Figure 2B:
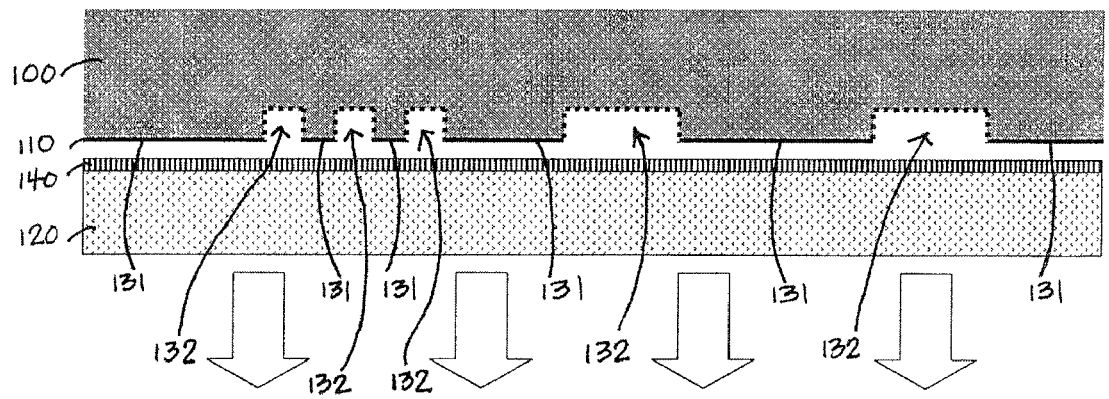
Figure 2C:
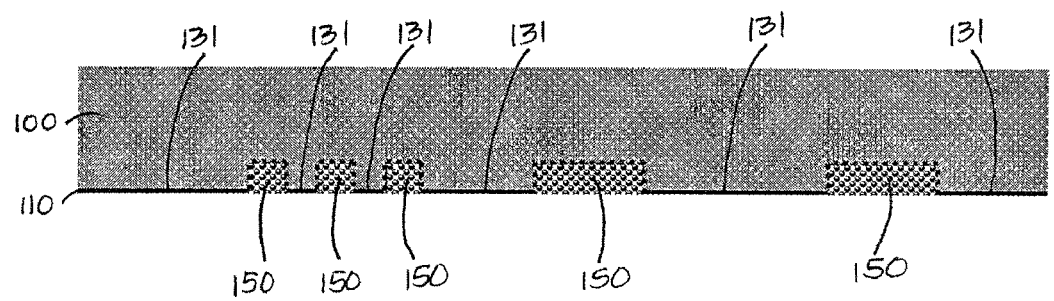

Some embodiments of the present invention are illustrated in FIGS. 2A-2C. FIG. 2A shows an embossed substrate 100 with barrier and seed layers 110 and a substantially flat chemistry carrier 120 which has been brought into contact with a top surface 130 of the substrate 100. The substrate 100 is provided with recesses 132.

While shown as a single layer for ease of illustration, it will be appreciated that the layer 110 can include two separately formed layers, a separately formed barrier layer and a separately formed seed layer. The barrier layer can formed of, e.g., tantalum, nitrides of tantalum, titanium, tungsten, TiW, or combinations thereof, or any other material that is commonly used in the art for forming barrier layers. The barrier layer can be deposited using various methods known in the art, including, e.g., sputtering and chemical vapor deposition (CVD). Thereafter, a seed layer is deposited on the barrier layer using various methods known in the art. For deposition of a desired metal, the seed layer may be formed of various conductive materials compatible with electrochemical deposition of the desired metal. For example, the seed layer may be copper or copper substitutes for deposition of copper into the recesses 132.

The chemistry carrier 120 preferably is shaped to contact the top surface 130 of the substrate 100. For a substantially flat substrate, the chemistry carrier 120 can be a substantially flat piece of material, e.g., a rigid flat body such as glass or a film, that is covered with a thin layer 140 of a chemically active material. The area of the chemistry carrier 120 preferably exceeds the area of the substrate 100 to be processed, so that the chemistry carrier 120 completely covers the substrate 100. In other embodiments, the chemistry carrier 120 is smaller in area than the substrate 100 and multiple exposures to the chemistry carrier 120 are used to contact all desired areas of the 100 substrate with the chemistry carrier 120.

It should be understood that other materials than glass, having the desired flatness, surface roughness and quality, can be used to form the chemistry carrier 120. The thin chemistry layer 140 shown in FIG. 2A can have a thickness of between about 1 and about 500 nm (preferably about 1-300 nm and, more preferably, about 50-100 nm) and can be deposited using various methods such as contact coating, spin coating, vapor condensation, chemical deposition from solution or other methods known in the art. One possible method for deposition of the thin layer 140 of chemically active material on a flat surface is arrangement of a chemical material as a monolayer film having a liquid surface (not shown). The film can subsequently be transferred to the chemistry carrier 120. Preferably, the film deposition results in a film with high uniformity, controlled thickness and continuity.

As discussed herein, substances used for the surface modification agent, or chemically active substance or material, can be a material chosen from the classes of polymers, thiols, amines and carboxylates. This list of materials is for illustration only and does not prevent using other materials with desired properties. The surface modification agent has the property of preventing deposition of a material at the points of contact with the substrate 100. Preferably, the surface modification agent has the ability to form complexes or chemical bonds with the substrate material, is easily handled, is non-toxic, has limited volatility, has desired (for different applications) solubility in process solvents, and has desired wettability to the substrate 100 and to the chemistry carrier 120. The surface modification agent may have two or more functional groups, each group reactive with one of the substrate 100 and the chemistry carrier 120. The chemical activity and reaction between the workpiece or substrate 100 and the surface modification agent includes oxidation, complex formation, change of conductivity and change of surface energy.

With reference to FIG. 2B the chemistry carrier 120 is separated from modified top surface 131 of the workpiece 100 after chemical modification of the barrier/seed layer 110 on embossed features by a contact solid phase chemical reaction. With reference to FIG. 2C, material 150 is selectively deposited into recesses 132. The deposition can be accomplished by various deposition methods known in the art. Advantageously, electroplating or other deposition process will only deposited material in non-modified areas of the workpiece. Other deposition process may include but are not limited to ALD, electroless plating, physical vapor deposition and chemical vapor deposition. In general any deposition process with selectivity to modified substrate surfaces 131 can be used for deposition of material into the recesses 132.

Figure 3A:
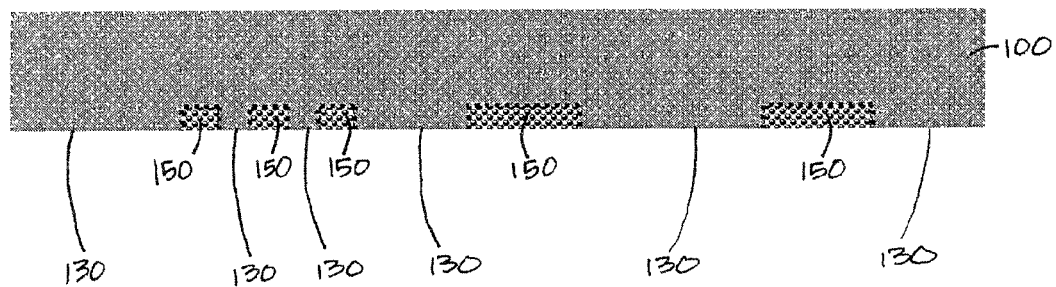
FIGS. 3A-3D are schematic, cross-sectional side views of various workpieces, showing examples of further processing steps according to some embodiments of the invention.

Selective chemical modification of workpiece surface 130 and selective deposition of material in recesses 132 allow further process advancements, as illustrated in FIGS. 3A-3D. With reference to FIG. 3A, the top surface 130 of the workpiece 100 can be non-selectively polished or etched to remove the barrier/seed layer 110 after selective deposition of conductive material 150 into recesses 132 (FIG. 2B). Additional material (for example high purity copper) can be deposited for annealing and defect reduction after selective deposition of conductive material in trenches. It will be appreciated that, by removing the barrier/seed layer 110, the additional material will advantageously preferentially grow on the already deposited material during a subsequent deposition.

Figure 3B:
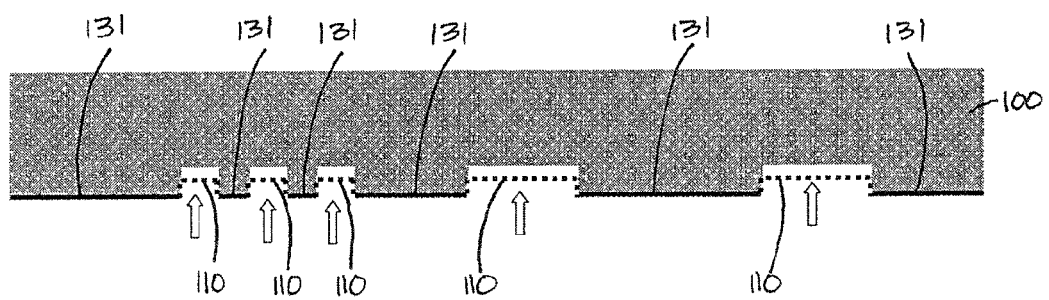

With reference to FIG. 3B, surfaces of the substrate 100 can be selectively modified as desired before forming barrier and/or seed layers. For example, the top surfaces of the substrate 100 can be selectively modified to form modified surfaces 131 before forming the barrier/seed layers 110. Advantageously, by preventing deposition of the seed/barrier layer over the field areas 131, contamination of the field areas (which may be formed of dielectric) by material forming the seed/barrier layers 110 can be avoided.

Figure 3C:
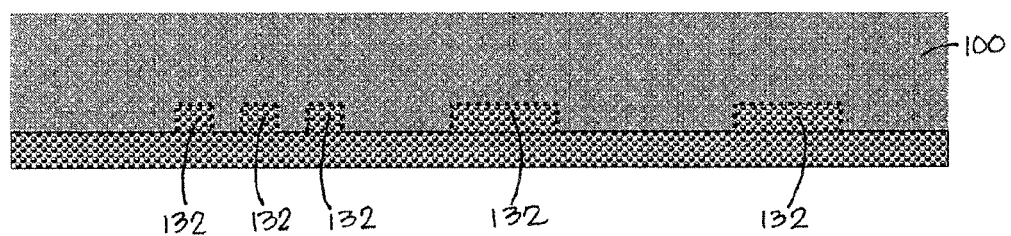

With reference to FIG. 3C, the surface of the substrate 100 is substantially planar after selective material deposition into recesses 132 and different, non-selective methods of material deposition can be used for the illustrated process step. This step does not require process selectivity (such as filling trenches in a plating process with accelerators/suppressors) and high purity materials can be deposited.

Figure 3D:
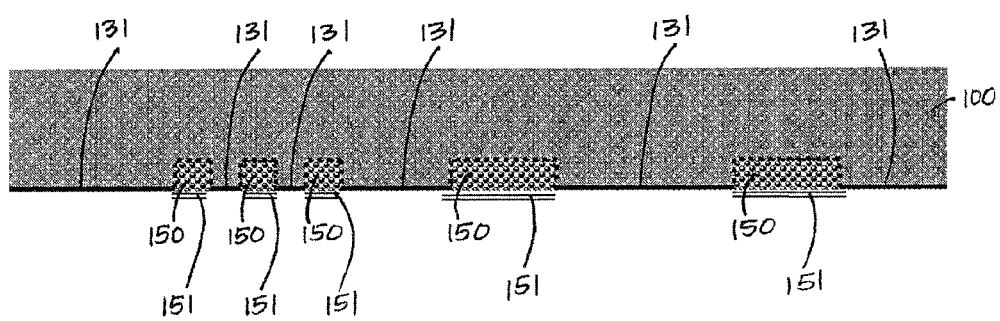

With reference to FIG. 3D, due to the different materials of the substrate 100 and the deposited material 150, additional materials may be selectively deposited on one of the substrate 100 or the deposited material 150. For example, material selective cupping, e.g., copper selective electroless cupping, can be used to form protective structures 151 to protect interconnects formed by the deposited material 150.

Figure 4A:
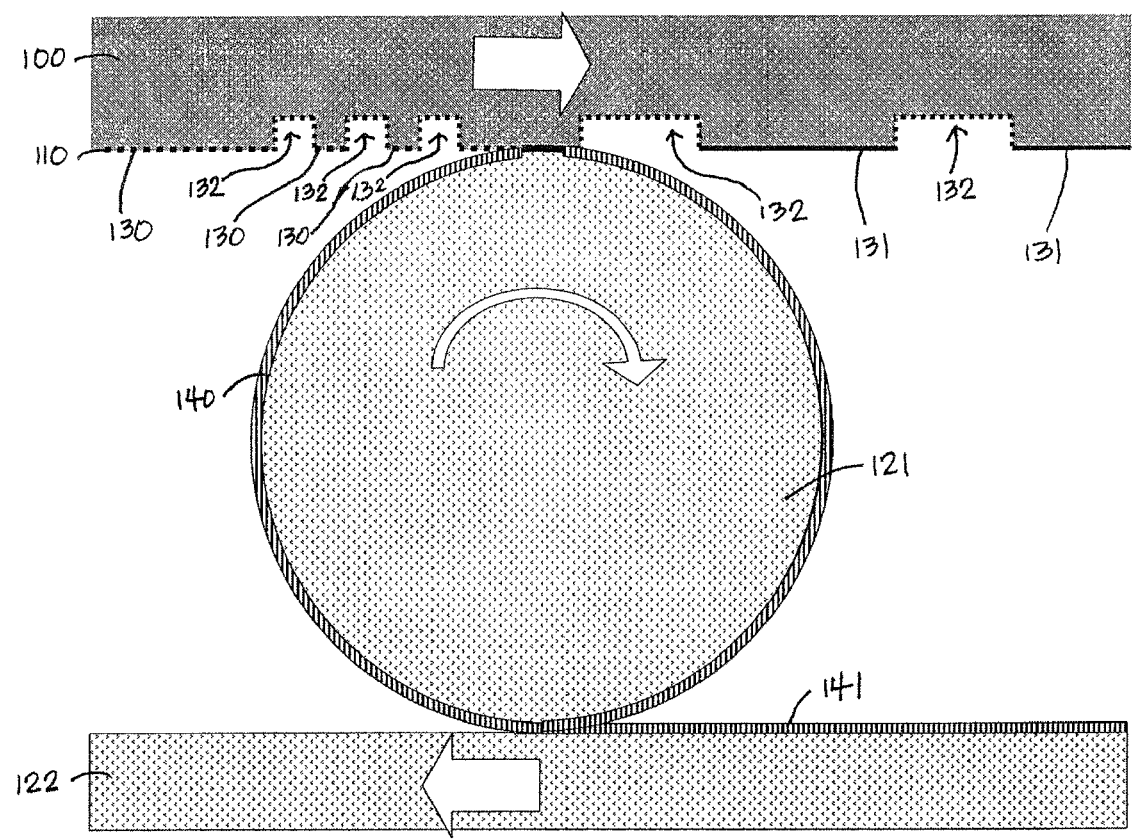
FIGS. 4A-4B are schematic, cross-sectional side views of a workpiece in contact with a roller, in accordance with other embodiments of the invention. The field areas of the workpiece are chemically modified after contact with the roller, which has a chemically active material on its surface.
Figure 4B:
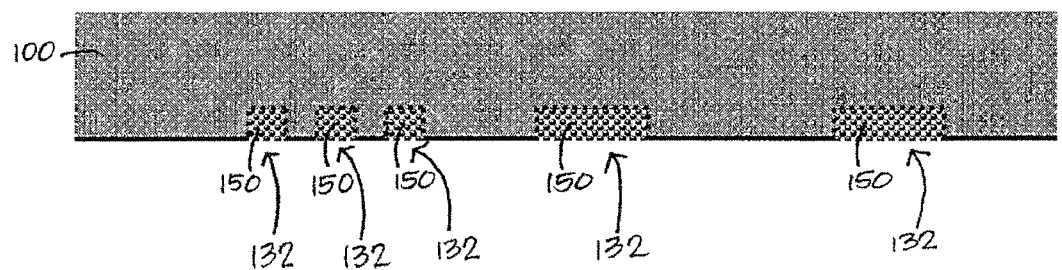

Additional embodiments of the invention are illustrated in FIGS. 4A-4B. The applicator for the surface modification agent is in the form of a roller 121 with a layer 140 of the surface modification agent, e.g., a chemically active material, on its surface. As illustrated, the roller 121 is brought into contact with the substrate 100. Preferably, the roller 121 has a uniform, rounded surface, such that the roller 121 touches only the top surfaces 130, 131 of the substrate 100 when it rolls over the substrate 100. The chemically active material on the roller surface may be replenished by contact with another chemistry carrier 122, e.g., a flat plate having a layer 141 of the surface modification agent, which functions as a reservoir for the surface modification agent. In some embodiments, the roller 121 simultaneously rolls over both the top surfaces 130, 131 of the substrate 100 and the surface of the other chemistry carrier 122. Thus, the roller 121 can simultaneously contact the top surfaces 130, 131 for chemical reaction of the surface modification agent with those surfaces, while also replenishing the surface modification agent on the surface of the roller 121.

Other methods for thin layer deposition of chemically active material on an applicator, or chemical carrier, can be used. Preferable thickness of chemically active material is 1 to 100 nm, substances are in general as described in previous embodiment. The field areas 131 of the workpiece 100 are chemically modified after contact with the roller 121. With reference to FIG. 4B, material 150 is selectively deposited into recesses 132 by, e.g., a conventional deposition method such as electrochemical plating.

Figure 5A:
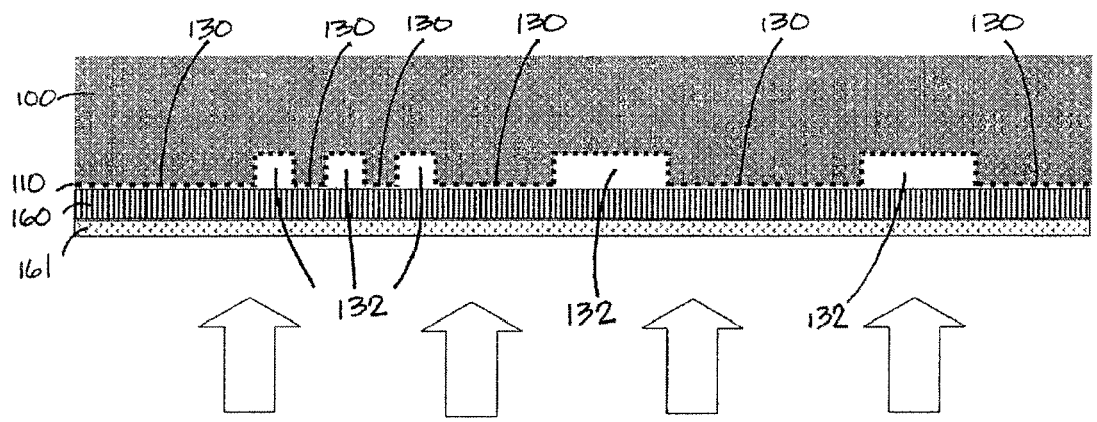
FIGS. 5A-5C are schematic, cross-sectional side views of a workpiece in contact with a semi-permeable membrane, in accordance with yet other embodiments of the invention. Chemically active material penetrates through the membrane and chemically modifies the top surface of workpiece.
Figure 5B:
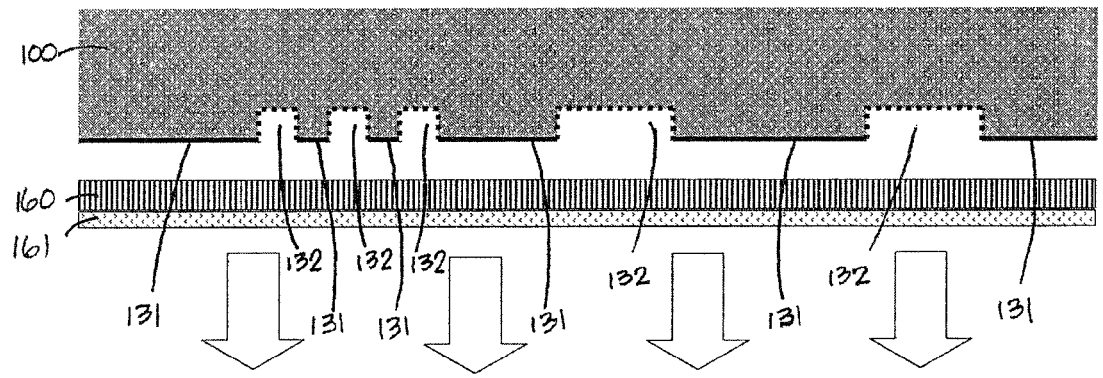
Figure 5C:
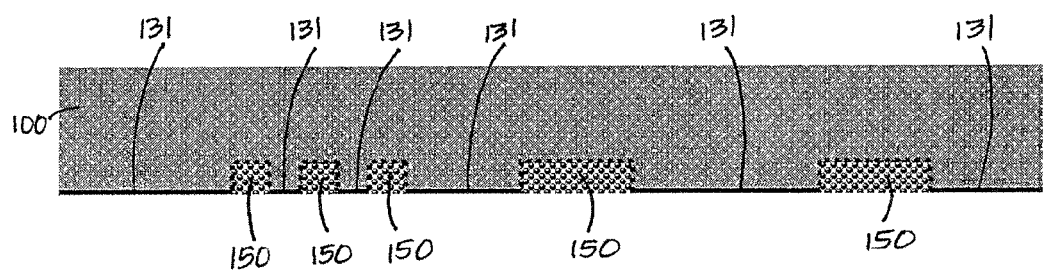

As illustrated in FIGS. 5A-5C, in some embodiments, a semi-permeable membrane 160 can be used to provide the surface modification agent to the top surface 130 of the substrate 100. A supply 161 of the surface modification agent is provided on a side of the semi-permeable membrane 160 opposite the substrate 100. In some embodiments, the semi-permeable membrane 160 is an ion-exchange membrane. With reference to FIG. 5A, the semi-permeable membrane 160 is brought into contact with the top surface 130 of the embossed workpiece 100. The semi-permeable membrane 160 allows penetration of certain, desired materials, while blocking other substances. An example of an ion-exchange membrane includes, without limitation, Nafion® produced by E. I. du Pont de Nemours and Company of Wilmington, Del. The surface modification agent penetrates through the semi-permeable membrane 160 and contacts and modifies the top surface 130 of the workpiece 100. The membrane 160 has sufficient structural integrity and rigidity that it does not touch surfaces of the recesses 132. Where the substrate 100 is substantially planar, the membrane 160 preferably also has a substantially planar surface for contacting the top surface 130. The surface modification agent does not reach into the recess 132 and does not modify surfaces of the recesses 132. The membrane 160 is separated from the workpiece 100 after chemical modification of the top surface 130 of the workpiece 100, as shown in FIG. 5B. Material 150 is subsequently selectively deposited into recesses 132 by, e.g., a conventional deposition method such as electrochemical plating, as shown in FIG. 5C.

Figure 6A:
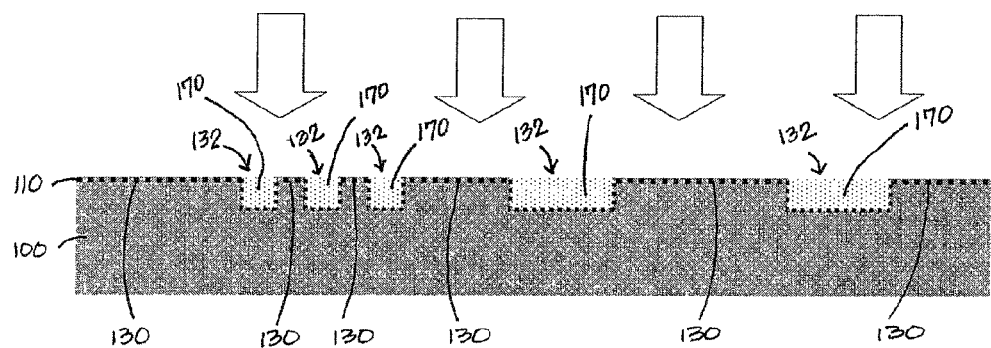
FIGS. 6A-6C are schematic, cross-sectional side views of a workpiece having cavities filled with a protective substance which is non-mixable with a substance chemically reactive with the surface of the workpiece, in accordance with other embodiments of the invention. Unprotected portions of the top surface are modified by contact with the chemically active substance.
Figure 6B:
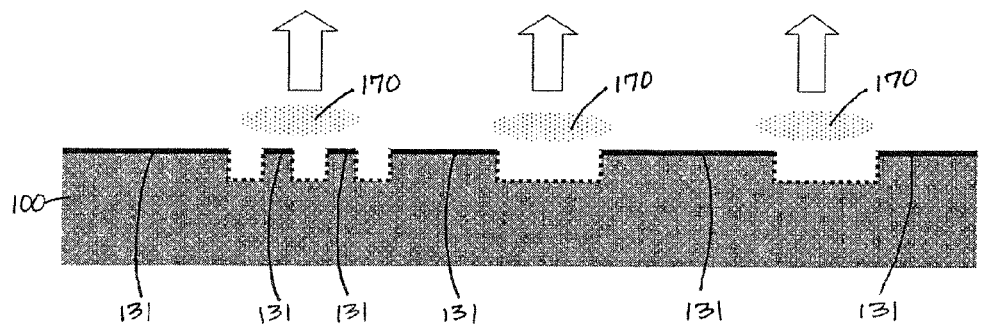
Figure 6C:
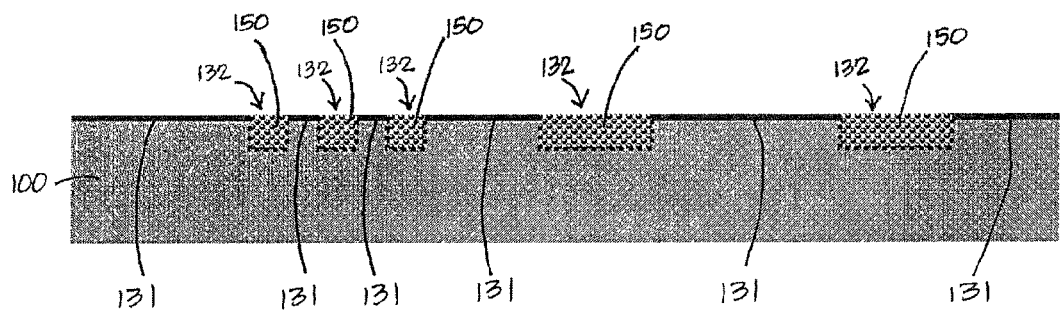

With reference to FIGS. 6A-6C, a masking material or protective substance 170 can be deposited in the recesses 132 to allow selective modification of the top surfaces 130. With reference to FIG. 6A; trenches and cavities 132 of the workpiece 100 are filled with the protective substance 170, which can be a liquid in some embodiments. The protective substance 170 is preferably immiscible with the chemically active substance. For example, the protective substance 170 can be non-polar, e.g., an oil-based liquid, and the chemically active substance can be polar, e.g., a water soluble substance. The protective substance 170 prevents the chemically active substance from contacting and modifying surfaces of the recesses 132. The unprotected top surface 130 of the workpiece 100 is modified to form modified surfaces 131 by contact with the chemically active substance, which can be in, e.g., gas or liquid form. The protective substance 170 in recesses 132 of the workpiece 100 prevents chemical modification of the recess surfaces, leading to different surface properties in the top surfaces 131 and the recesses 132 of the workpiece 100. With reference to FIG. 6B, the protective substance 170 is removed from the cavities and trenches 132 of the workpiece 100 after surface modification is accomplished. The removal can be accomplished by various methods, including, e.g., evaporation. With reference to FIG. 6C, material 150 is subsequently selectively deposited into the recesses 132 by, e.g., a conventional deposition method such as electrochemical plating.

Figure 7A:
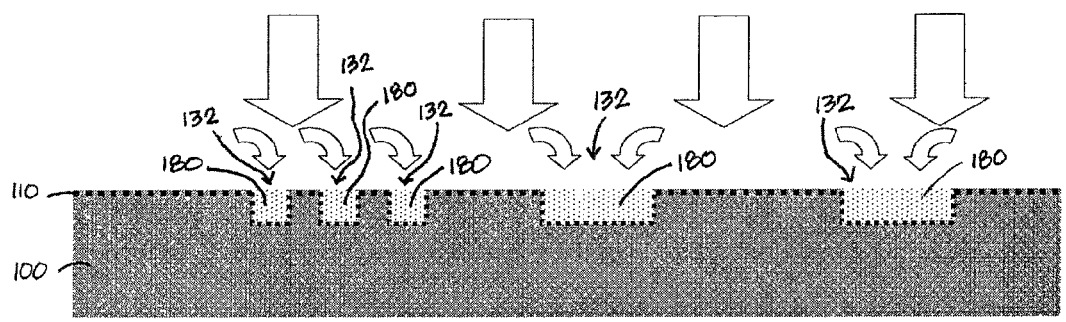
FIGS. 7A-7C are schematic, cross-sectional side views of a workpiece having cavities filled with a protective substance which is highly mixable with a substance chemically reactive with the surface of the workpiece, in accordance with yet other embodiments of the invention. The workpiece is exposed to a substance chemically reactive with the surface of the workpiece, which accumulates in the cavities and modifies surfaces of the cavities.
Figure 7B:
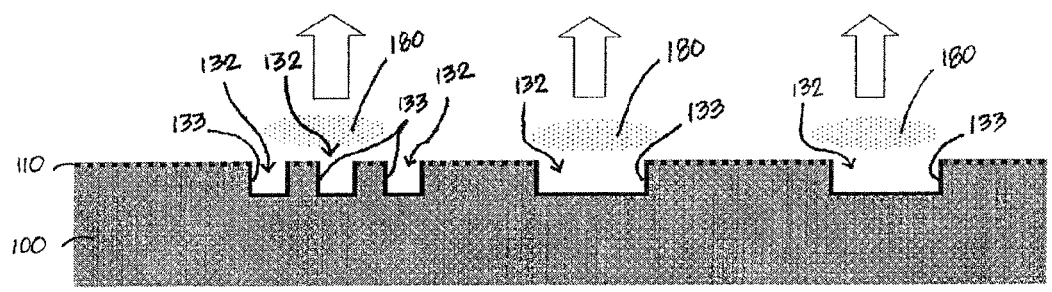
Figure 7C:
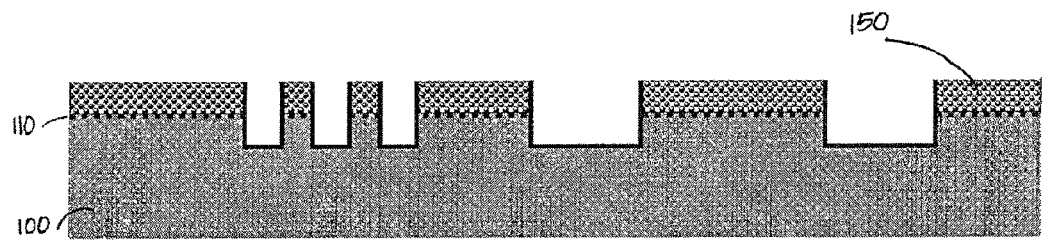

With reference to FIGS. 7A-7C, in some embodiments, material can be selectively deposited in field areas of a workpiece 100 rather than in recesses. With reference to FIG. 7A, the trenches and cavities 132 of the workpiece 100 are filled with a substance 180 (preferably a liquid) which is miscible with the surface modification agent. The miscibility of the substance 180 and the surface modification agent is understood in wide terms of solubility, affinity or any other chemical or physical attraction. In some embodiments, the substance 180 is water and the surface modification agent is MPTES.

With continued reference to FIG. 7A, as indicated by arrows, the workpiece 100 is exposed to a surface modification agent in gas, film or liquid form. Advantageously, the high miscibility of the substance 180 with the surface modification agent results in the mixing, retention and accumulation of the surface modification agent in recesses 132. Thus, surface modification occurs in the trenches and cavities 132, resulting in modified surfaces 133 (FIG. 7B).

With reference to FIG. 7B, the substance 180 is removed from cavities and trenches 132 of the workpiece 100 by, e.g., evaporation. With reference to FIG. 7C, material is selectively deposited on top surfaces 130 of the workpiece 100 by, e.g., a conventional deposition method such as electrochemical plating.

It will be appreciated that the material deposition of FIG. 7C is reversed relative to the situation of embodiments targeting selective material deposition in recesses. FIG. 7C shows the advantageous ability of embodiments of the present invention to control the selectivity of material deposition.

The feasibility of embodiments of the invention is illustrated in FIGS. 8-13, showing different samples of test wafers processed according to embodiments of the invention.

Figure 8A:
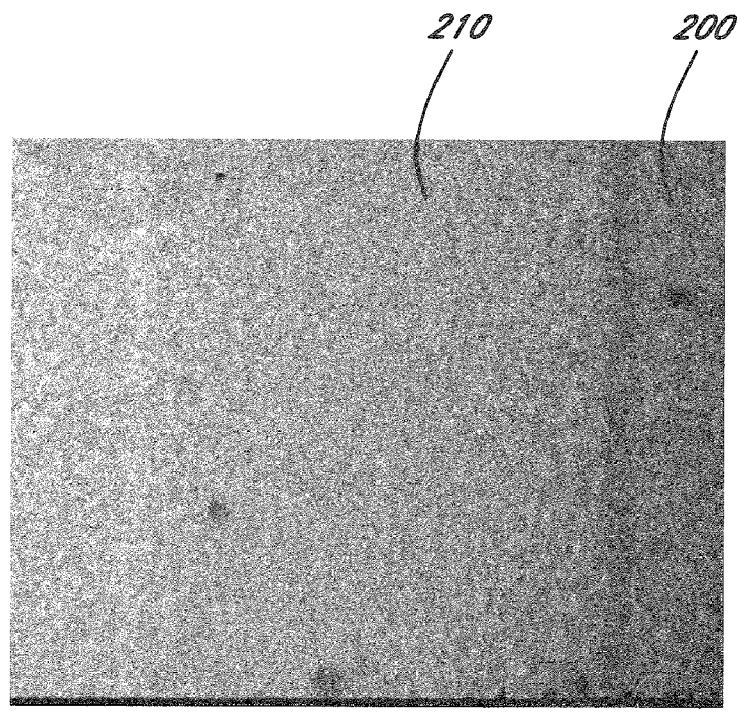
FIGS. 8A-8B are top views showing the results of copper electroplating on a workpiece without and with selective surface modification according to embodiments of the invention.

FIG. 8A is optical image of a test wafer (a patterned wafer) after copper electroplating on the test wafer without any surface modification. The trench and field areas of the wafer were plated with copper using a $H_2SO_4/CuSO_4$ plating solution with a platinum counter electrode at a current density of 30 mA per square inch for 1 minute. It will be appreciated that the roughness of the deposited film can be reduced by optimization of current density, cell configuration and chemistry additives, as known in the electroplating art. The plating optimization was omitted in the present experiments for process simplification and for visualization purposes. It can be seen that copper has been deposited on both field area 200 and trench 210.

Figure 8B:
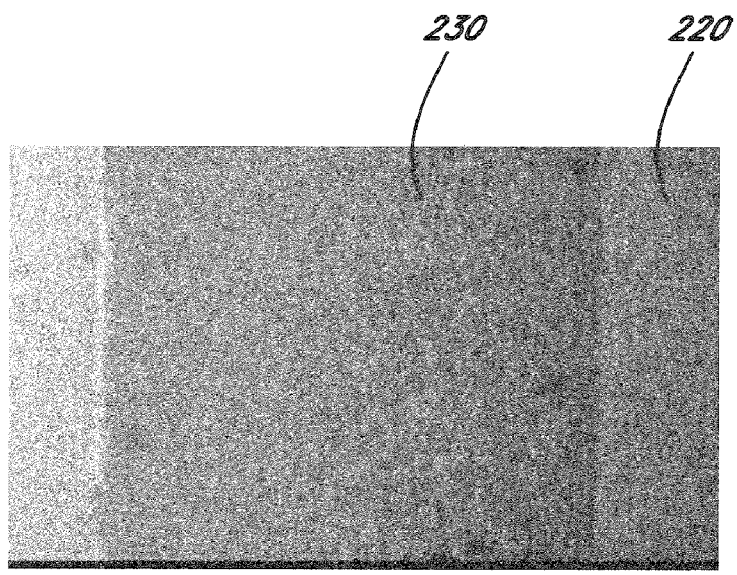

With reference to FIG. 8B, the same copper electroplating as performed with reference to FIG. 8A is performed on another wafer with selective surface modification of field area 220 resulting in copper deposition in trench 230 only, while field area 220 remains intact. The wafer used in this test was modified as discussed with reference to the embodiments illustrated in FIGS. 2A-2C. Microscope cover glasses were used as flat substrates for chemistry carrying. The glass plates were covered with a thin layer of MPTES (mercaptopropyl-triethoxysilane) (a thiol class substance), which was made to contact the wafer, to react with the field area 220. Advantageously, the quality and thickness of the MPTES coating was not specifically controlled and was allowed to vary in a wide range. The positive results of these experiments show that embodiments of the invention are robust and reliable.

Figure 9:
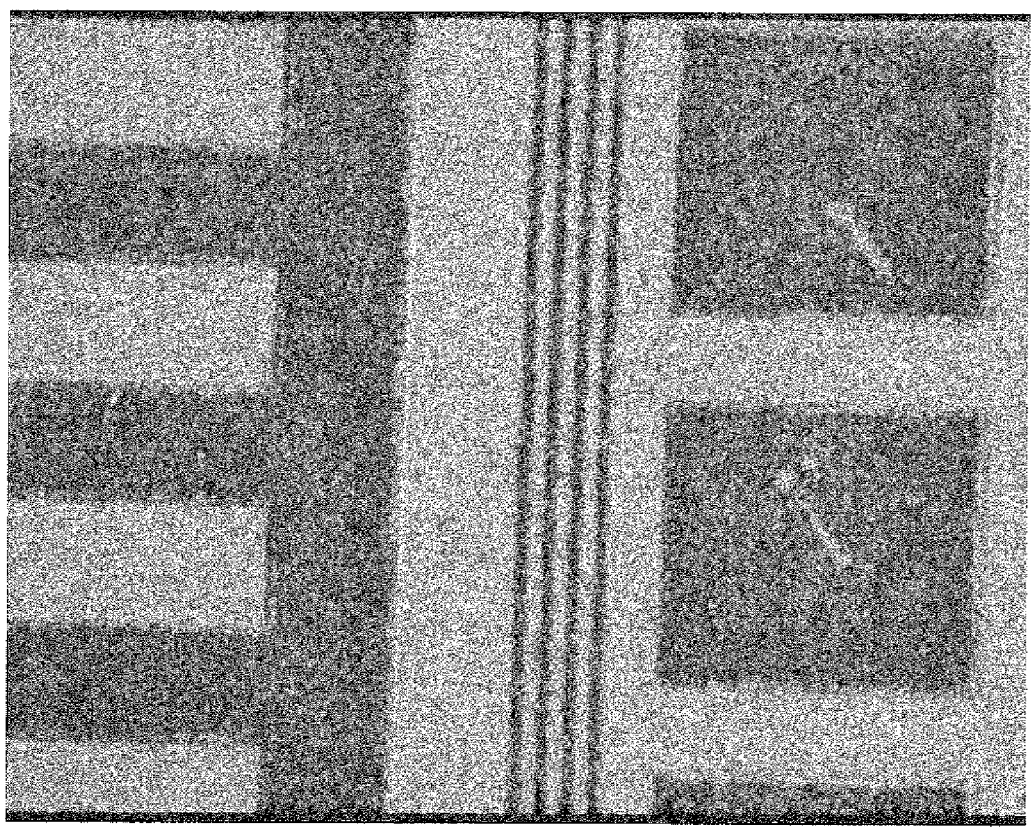
FIG. 9 is a top view showing the results of selective deposition in different features of a test wafer, according to embodiments of the invention.
Figure 10A:
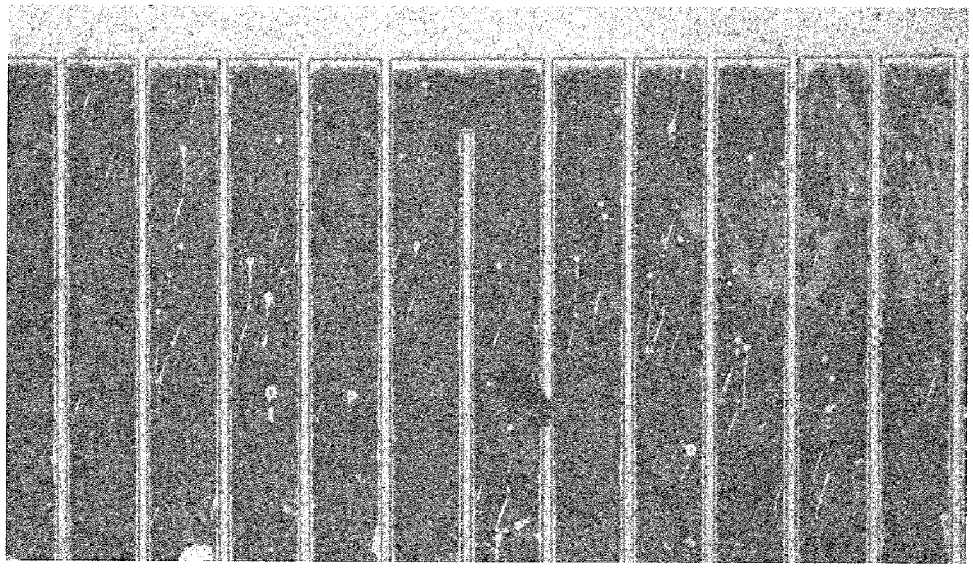
FIGS. 10A-10B are top views showing the results of selective deposition on different features of a test wafer, according to embodiments of the invention.
Figure 10B:

Other results of experiments with selective deposition in wide and narrow trenches and in different structures of test wafers are presented in FIGS. 9-10. The electrochemically deposited copper appears dark in the images due to the higher surface roughness of the deposited copper. In all cases, the modified field areas of the workpieces were free from copper deposition, confirming the effectiveness of embodiments of the invention.

Figure 11:
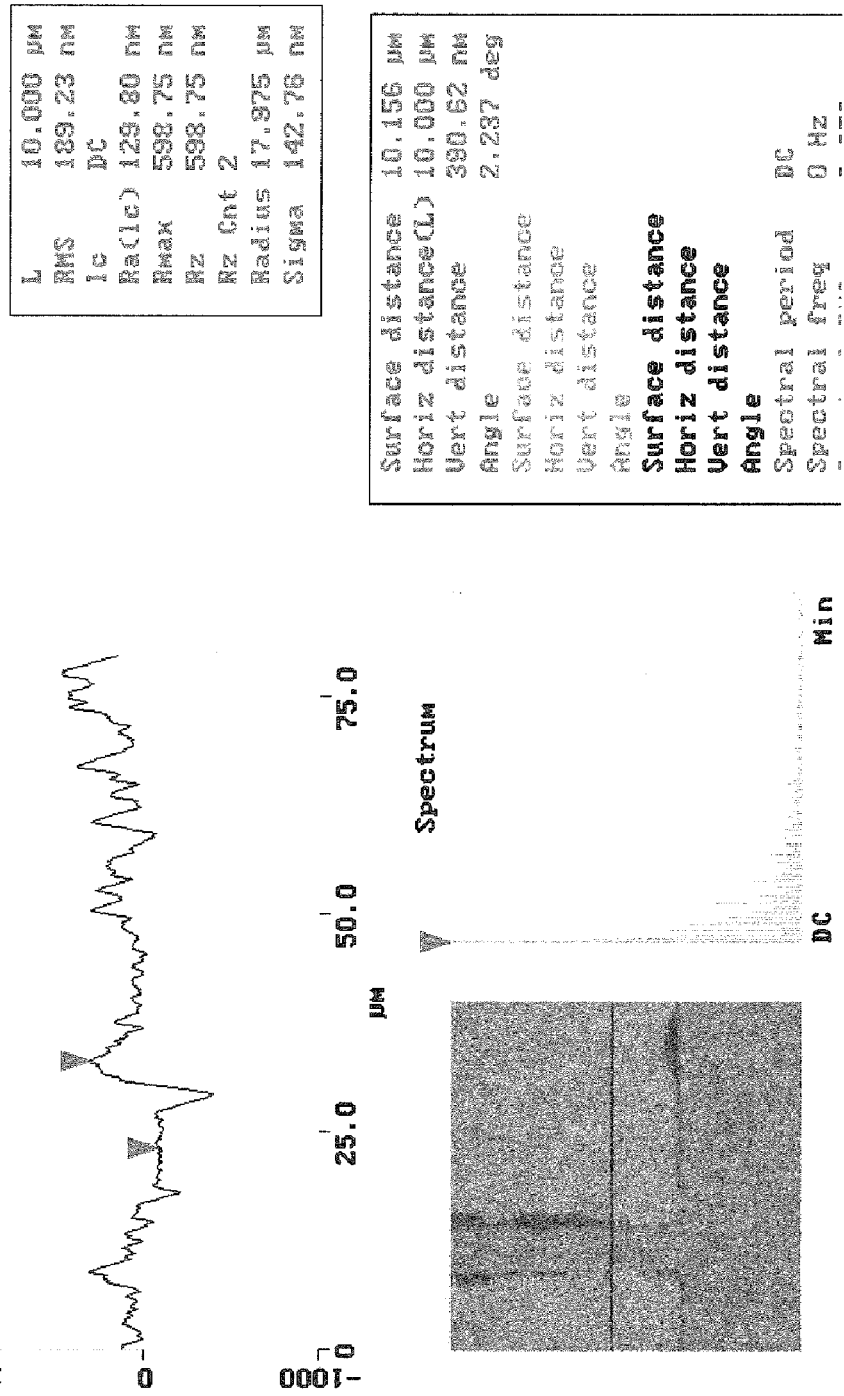
FIG. 11 is an AFM image and measurement of the results of selective deposition, according to embodiments of the invention.

The ability of embodiments of the invention to allow complete fill of trenches is illustrated also in FIG. 11, which shows an AFM image and measurements of samples with selective copper deposition in trenches. Initial trench depth (not shown) was ~500 nm. Advantageously, after the selective material deposition, the copper in the trench was higher than in the field area.

Figure 12:
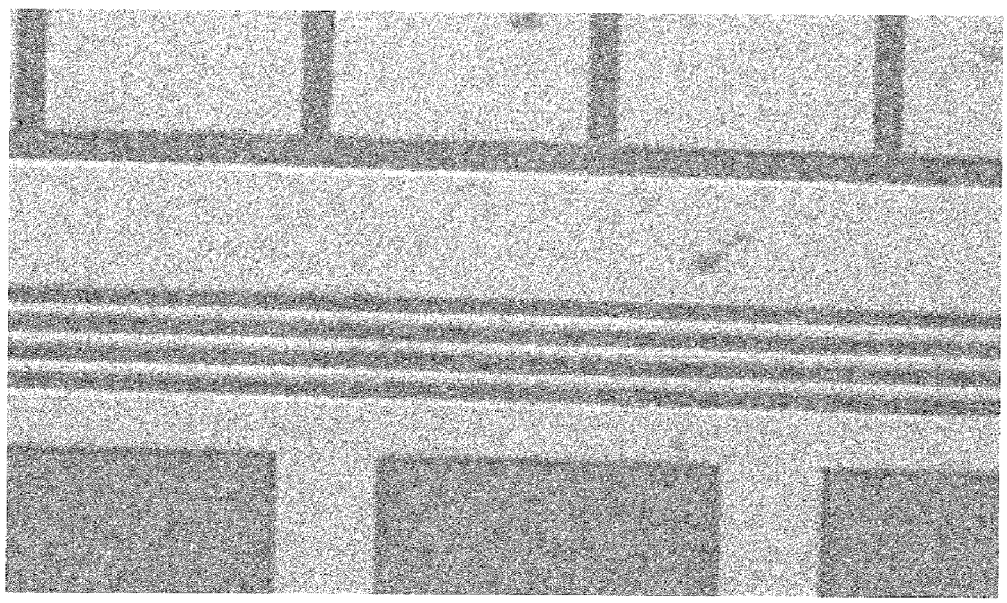
FIG. 12 is a top view showing the results of selective deposition into different trenches of a test wafer, according to embodiments of the invention.
Figure 13:
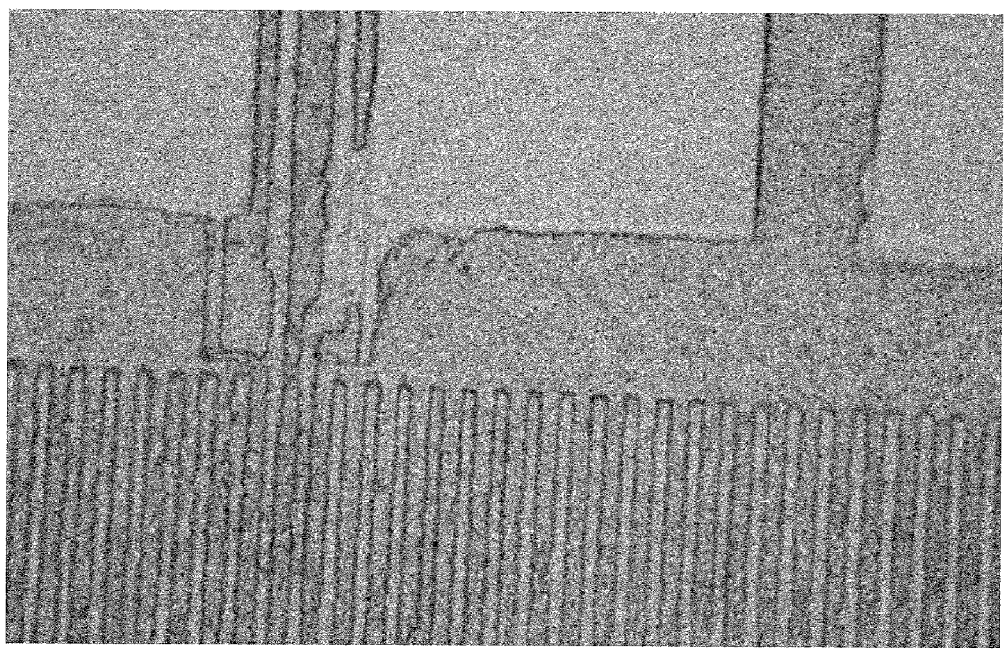
FIG. 13 is a top view showing selective deposition on field areas while trenches of a test wafer are protected from deposition.

FIG. 13 shows the results of selective deposition on field areas of a wafer, while trenches of the wafer were protected from deposition according to the embodiments discussed with reference to FIG. 7A-7C. The starting pattern of trenches, recessed squares and lines, is similar to that of the wafer shown in FIG. 12. In FIG. 12, the recessed areas of the workpiece exhibit material deposition (darker color), but in FIG. 13 the situation is reversed-material (dark color) is deposited in field areas of the workpiece. These results illustrate advantages of the present invention, with controlled deposition of material either on elevated or on recessed features of a workpiece.

Figure 14:
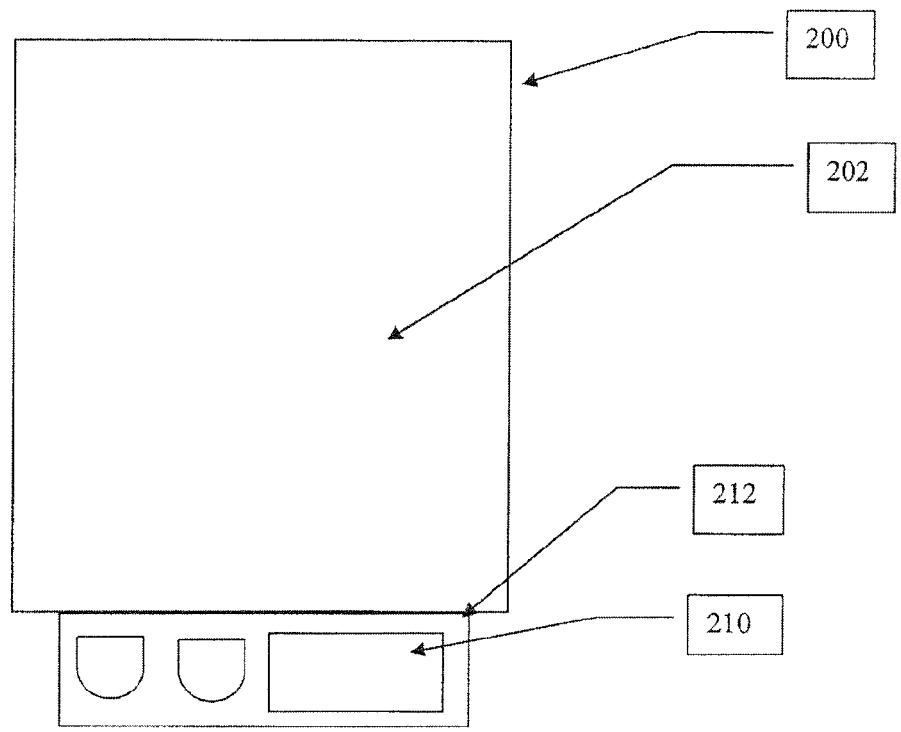
FIG. 14 is a schematic illustration of an apparatus, a deposition system, according to embodiments of the invention.
Figure 15:
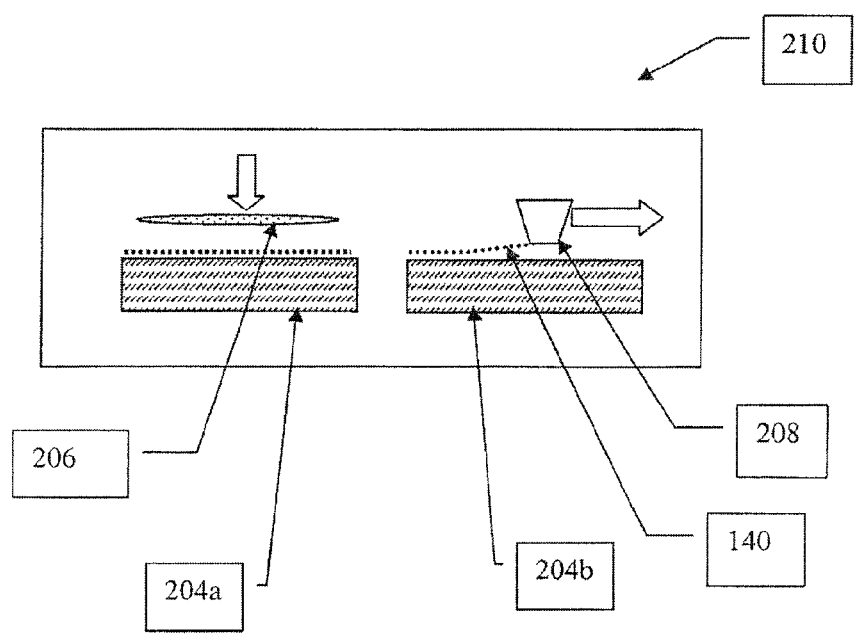
FIG. 15 is a schematic illustration of the apparatus of FIG. 14, showing a surface modification module in isolation.

It will be appreciated that preferred embodiments of the invention can be used with various deposition systems known in the art, and have particular advantages for electrochemical deposition systems. FIGS. 14 and 15 show schematically a system 200 for integrated fabrication. The system 200 includes a deposition apparatus 202, e.g., a deposition chamber such as an electrochemical deposition chamber or a plating tool. The system 200 also includes one or more chemistry carriers 204a, 204b, e.g., a solid state chemistry carrier, which can be any of the chemistry carriers described herein, which is connected to a source 208 of a surface modification agent 140. The source 208 replenishes the supply of the surface modification agent 140 on the chemistry carriers 204a, 204b. It will be appreciated that the chemistry carriers 204a, 204b can be provided within the same chamber or housing that material deposition occurs, or the chemistry carriers 204a, 204b can be provided in different chambers, which can have advantages for producing high quality process results. For example, the surface modification can take place in a surface modification module 210, which is provided at an interface 212 between the deposition apparatus 202 and an outside manufacturing facility environment, e.g., a clean room.

Advantageously, a separate surface modification module 210 has advantages for ease of retrofitting existing processing systems with the chemistry carrier 204. While two chemistry carriers are illustrated, which has advantages for increasing throughput by allowing a chemistry carrier 204a to be replenished with surface modification agent while another chemistry carrier 204b is used to modify the surface of a workpiece 206, it will be appreciated that more than two, or only a single chemistry carrier can be provided in the surface modification module 210.

It will be appreciated by those skilled in the art that other various omissions, additions and modifications can be made to the embodiments described herein without departing from the scope of the invention. All such modifications and changes are intended to fall within the scope of the invention, as defined by the appended claims.

I claim:

1. A selective deposition method, comprising:
providing a workpiece having a top surface and a via open to the top surface;
providing a surface modification agent comprising two or more functional groups, one of the functional groups reactive with the top surface and another of the functional groups reactive with an applicator;
attaching the surface modification agent to the applicator;
selectively contacting the top surface with the surface modification agent on the applicator thereby selectively chemically modifying the top surface relative to surfaces of the recess; and
subsequently selectively depositing material into the vias relative to the top surface.

2. The method of claim 1, wherein the via extends at least partially through a thickness of the workpiece.

3. The method of claim 2, wherein the via is part of a dual damascene structure, wherein the via extends into the workpiece from a bottom of a trench.

4. The method of claim 3, wherein subsequently selectively depositing material into the vias comprises filling the trench with the material.

5. The method of claim 1, wherein subsequently selectively depositing comprises electroplating.

6. The method of claim 1, wherein subsequently selectively depositing comprises depositing a metal.

7. The method of claim 6, wherein the metal is chosen from the group consisting of copper, nickel, aluminum, titanium, molybdenum, and combinations and alloys thereof.

8. The method, of claim 1, wherein subsequently selectively depositing comprises depositing a material chosen from the group consisting of doped polysilicon, doped single-crystal silicon, titanium, and refractory metal silicides.

9. The method of claim 1, further comprising depositing a seed layer over the top surface and surfaces of the via before selectively contacting the top surface.

10. The method of claim 1, wherein selectively contacting comprises mechanically contacting the top surface with the applicator having the surface modification agent on an applicator surface for contacting the top surface.

11. The method of claim 10, wherein the applicator is selected from the group consisting of a rigid flat body, a film, a roller and a semi-permeable membrane.

12. The method of claim 1, wherein selectively contacting comprises depositing an immiscible material into the recesses, wherein the immiscible material is immiscible with the surface modification agent.

13. The method of claim 1, wherein the surface modification agent is MPTES.

14. The method of claim 1, wherein the surface modification agent is a material selected from the group consisting of polymers, thiols, P-, s-, t-amines and carboxylates.

15. The method of claim 1, wherein selectively chemically modifying comprises oxidation, complex formation, change of conductivity or change of surface energy.

16. The method of claim 1, wherein the workpiece comprises a silicon wafer.

17. A selective deposition method, comprising:
providing a workpiece having a top surface and a recess extending into the workpiece from the top surface;
providing a surface modification agent attached to an applicator, the surface modification agent comprising two or more functional groups, one of the functional groups reactive with the top surface and another of the functional groups reactive with the applicator;
selectively contacting one or more portions of the top surface with the surface modification agent on the applicator thereby selectively chemically modifying the one or more portions of the top surface relative to surfaces of the recess; and
subsequently selectively depositing material into the recess relative to the chemically modified one or more portions of the top surface.

18. The method of claim 17, wherein the workpiece is a solar panel.

19. The method of claim 17, wherein subsequently selectively depositing material comprises performing an atomic layer deposition.

20. The method of claim 17, wherein the surface modification agent forms a layer on the applicator, the layer having a thickness of about 1-300 nm.

21. The method of claim 20, wherein the thickness is less than about 100 nm.

22. The method of claim 20, wherein the recess is a via extending at least partially through the workpiece.

23. The method of claim 17, further comprising:
providing a liquid in the recess before selectively contacting the top surface with the surface modification agent; and
removing the liquid before subsequently selectively depositing material into the recess.

24. The method of claim 23, wherein the liquid is non-polar.

25. The method of claim 17, wherein selectively contacting the one or more portions of the top surface comprises contacting less than an entire area of the top surface with the surface modification agent.

26. A method for selective deposition, comprising:
providing a workpiece having a field area and a recess open to the field area;
providing a liquid in the recess;
contacting the field area and the liquid with a surface modification agent that is immiscible with the liquid, wherein the surface modification agent selectively reacts with the field area to selectively chemically modify the field area relative to a surface of the recess;
removing the liquid from the recess; and
subsequently selectively depositing material into the recess.

27. The method of claim 26, wherein the liquid is non-polar.

28. The method of claim 27, wherein the liquid is an oil.

29. The method of claim 26, wherein contacting the field area and the liquid comprises mechanically contacting the field area with a chemistry applicator having the surface modification agent disposed thereon.

30. The method of claim 25, wherein selectively contacting the one or more portions of the top surface comprises exposing the top surface to the surface modification agent a multiple number of times to contact all desired areas of the top surface with the surface modification agent.

* * * * *